(12) United States Patent
Boomer et al.

(10) Patent No.: US 8,704,552 B2
(45) Date of Patent: *Apr. 22, 2014

(54) MIPI ANALOG SWITCH FOR AUTOMATIC SELECTION OF MULTIPLE IMAGE SENSORS

(75) Inventors: James B. Boomer, Monument, CO (US); Oscar W. Freitas, Cape Elizabeth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/529,441

(22) Filed: Jun. 21, 2012

(65) Prior Publication Data

US 2012/0326764 A1    Dec. 27, 2012

Related U.S. Application Data

(63) Continuation of application No. 12/402,794, filed on Mar. 12, 2009, now Pat. No. 8,207,759.

(51) Int. Cl.
*H03K 5/22* (2006.01)
*H03K 5/153* (2006.01)
*H03K 19/23* (2006.01)
*H04N 5/232* (2006.01)

(52) U.S. Cl.
USPC ............ 327/63; 327/82; 326/35; 348/211.99

(58) Field of Classification Search
USPC ................. 327/82, 63; 370/532, 916; 326/35; 348/211.1–211.99
See application file for complete search history.

(56) References Cited

U.S. PATENT DOCUMENTS

| | | |
|---|---|---|
| 3,803,425 A | 4/1974 | Carp |
| 3,956,591 A | 5/1976 | Gates, Jr. |
| 4,347,510 A | 8/1982 | Ishigaki et al. |
| 5,223,742 A | 6/1993 | Schumacher |
| 5,262,681 A | 11/1993 | Takeda |
| 5,272,393 A | 12/1993 | Horiguchi et al. |
| 5,306,962 A | 4/1994 | Lamb |
| 5,483,185 A * | 1/1996 | Scriber et al. ................... 327/99 |
| 5,831,464 A | 11/1998 | Lang |
| 6,335,641 B1 | 1/2002 | Tougou |
| 6,453,425 B1 * | 9/2002 | Hede et al. ................... 713/501 |
| 6,628,146 B2 | 9/2003 | Tam |
| 6,693,476 B1 | 2/2004 | Lin |
| 6,819,915 B2 | 11/2004 | Lin |
| 6,922,091 B2 | 7/2005 | Kizer |
| 6,975,145 B1 | 12/2005 | Vadi et al. |
| 6,980,789 B2 | 12/2005 | Lin |

(Continued)

OTHER PUBLICATIONS

"U.S. Appl. No. 12/402,794, Non Final Office Action mailed Sep. 23, 2011", 11 pgs.

(Continued)

*Primary Examiner* — Chia-Wei A Chen
(74) *Attorney, Agent, or Firm* — Schwegman, Lundberg & Woessner, P.A.

(57) ABSTRACT

An MIPI interface is connected to two sensor sources that each may be transferring both high and low speed information, typically video information in the high speed state. The clock signals are monitored and when one of the clock signals exceed a threshold, an analog switch between the MIPI interface and the sensors, may connect the other source to the MIPI interface.

24 Claims, 4 Drawing Sheets

(56) References Cited

U.S. PATENT DOCUMENTS

| | | | |
|---|---|---|---|
| 7,471,120 B2 * | 12/2008 | Lou | 327/99 |
| 7,532,648 B2 | 5/2009 | Sweet | |
| 7,548,127 B2 | 6/2009 | Morini et al. | |
| 7,629,828 B1 * | 12/2009 | Nekl | 327/298 |
| 7,768,296 B2 * | 8/2010 | Kase et al. | 326/27 |
| 7,840,819 B2 | 11/2010 | Chang et al. | |
| 7,893,748 B1 * | 2/2011 | Nekl | 327/298 |
| 7,894,491 B2 | 2/2011 | Batty et al. | |
| 7,969,196 B2 | 6/2011 | Bennett et al. | |
| 8,207,759 B2 | 6/2012 | Boomer et al. | |
| 2003/0052806 A1 | 3/2003 | Hochschild | |
| 2003/0141911 A1 | 7/2003 | Steiss et al. | |
| 2006/0132190 A1 | 6/2006 | Driediger et al. | |
| 2006/0264176 A1 * | 11/2006 | Hong | 455/41.2 |
| 2007/0080735 A1 | 4/2007 | Uladzimir | |
| 2007/0194804 A1 * | 8/2007 | Kase et al. | 326/27 |
| 2008/0002057 A1 * | 1/2008 | Takama et al. | 348/516 |
| 2008/0048729 A1 | 2/2008 | Ehrenreich | |
| 2008/0309375 A1 | 12/2008 | Schnarr | |
| 2009/0023409 A1 * | 1/2009 | Kato et al. | 455/205 |
| 2009/0049206 A1 | 2/2009 | Olschner et al. | |
| 2010/0029234 A1 * | 2/2010 | Joos et al. | 455/209 |
| 2010/0231285 A1 | 9/2010 | Boomer et al. | |
| 2011/0076973 A1 * | 3/2011 | Henson et al. | 455/179.1 |
| 2011/0164663 A1 | 7/2011 | Safiri | |

OTHER PUBLICATIONS

"U.S. Appl. No. 12/402,794, Notice of Allowance mailed Feb. 29, 2012", 8 pgs.

"U.S. Appl. No. 12/402,794, Response filed Nov. 29, 2011 to Non Final Office Action mailed Nov. 23, 2011", 8 pgs.

* cited by examiner

MIPI ANALOG SWITCH FOR AUTOMATIC SELECTION OF MULTIPLE IMAGE SENSORS

RELATED APPLICATION

This application is a continuation of and claims the benefit of priority under 35 U.S.C. §120 to U.S. patent application Ser. No. 12/402,794, filed on Mar. 12, 2009, which is hereby incorporated by reference herein in its entirety.

FIELD OF THE INVENTION

The present invention relates to sending data from two or more sources to an MIPI (Mobile Industry Processor Interface) receiver and, more particularly, to efficiently switching among the sources.

BACKGROUND

Mobile phones are constrained in how many signal tines can be sent between sections of flip, clam shell and slide phones. MIPI interfaces have minimized the signal lines by serializing the transmitted data commonly found in such phones. An MIPI interface, see below, typically has a single clock "lane," CLK, and two data "lanes," D1 and D2, that carry serial data. These three lanes carry signals on pairs of wires, the signals often being differential. Since the MIPI is a point-to-point interface, however, a separate GPIO (general purpose I/O) signal is employed with an analog switch if two sources are sending data to an MIPI interface.

"Coupled," and "connected" are used interchangeably herein and may include other relatively passive components that do not substantially alter the functions being described.

FIG. 1 illustrates a processor 8, with a single camera MIPI interface 2 communicating with two image sensors 4 and 6 via an analog switch 10. Here item 4 is a mega-pixel snapshot image sensor and item 6 is a low resolution video image sensor. The MIPI interface 2 is shown within an application processor 8, but it may be shown as a stand alone controller. The application processor also controls a GPIO, a General Purpose Input-Output interface 12. The GPIO 12 provides the SEL signal that selects which of the two sensors conies through the analog switch 10.

Some issues with the prior art include the use of an additional GPIO interface that must be separately addressed by the processor 8.

The MIPI specification is known to those skilled in the art. That specification is briefly described below to provide an environment framework for the present invention. More detailed information can be obtained by referring to the specification itself.

An MIPI interface has a high speed (HS) operation where D1 and D2 data lanes operate as a differential pair of wires to indicate a logic 1 or 0. An MIPI interface also has a Low Power (LP) and a ULP (Ultra Low Power) state or mode of operation, where each of the two wires, referenced as Dp and Dn, in the data and the clock lanes are driven independently. So in LP or ULP operation there are four possible states of the Dp and Dn wires: 11, 10, 01, and 00. Note in this notation, the values of each Dp and Dn occur at the same time In HS operation, if both the Dp and Dn signals of a data or a clock lane are driven high, for a minimum required time, that lane drives the MIN into a STOP or CONTROL state.

When in the STOP state the sequence of data on the Op, Dn wires may define a request to enter into other states. For example a data lane sequence of LP-11>10>00>01>00 will enter the ESCAPE STATE. Once in the ESCAPE mode, an eight bit command may be sent via "Spaced-One-Hot" coding. This coding means that sending a logic 1, termed Mark-1 or a logic 0, termed a Mark-0, is interleaved with a Space state (a zero), where each of the Mark's and Space consists of two parts. That is a Mark-1 is defined as a LP-10 (Dp=1, Dn=0), and a Mark-0 is a LP-01 and a Space is a LP-00, For example, sending a "one" via a LP MIPI interface in the ESCAPE mode would be the following sequence: LP-10>00; and sending a "zero" sequence would be LP-01>00.

In addition a clock lane may enter a STOP mode by driving both Dp and Dn of the clock lane high, From the STOP state the clock may enter the ULPS state by LP-01 or the HS state by LP-10, as discussed below.

OVERVIEW

The present invention addresses some of the issues of the prior art by interfacing two or more sources to a receiving MIPI interface without an external GPIO or other such interface two select between or among the sources. The present invention recognizes that the clock signals as defined in the MIPI specification may be used to control the selection, illustratively, between two sources.

The present invention provides selecting and connecting one of two sources to an MIPI interface without using a GPIO or other external interface module. Moreover, the selection of which source is connected to the MIPI receiver may be accomplished by decoding only clock signals.

Illustratively, when an MIPI source, that is a source meant to be connected to an MIPI interface, changes from a high speed state to a low speed state or vice versa, the system must first go into the STOP state, LP-11. In order to accomplish this, the clock signals exhibit a larger voltage swing. That larger voltage swing may be detected and used to select which of two sources should be connected to the MIPI interface.

Illustratively, when the STOP state is entered both of the differential clock signals of each of CLKA and CLKB go high, and, in one embodiment, both are monitored. But in other embodiments, only one of the differential clock signals of CLKA and CLKB may be monitored, The monitor/detector may be a simple logic gate, but a more accurately thresholded comparator may be used.

This overview is intended to provide an overview of subject matter of the present patent application, It is not intended to provide an exclusive or exhaustive explanation of the invention. The detailed description is included to provide further information about the present patent application. It will be appreciated by those skilled in the art that although the following detailed description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
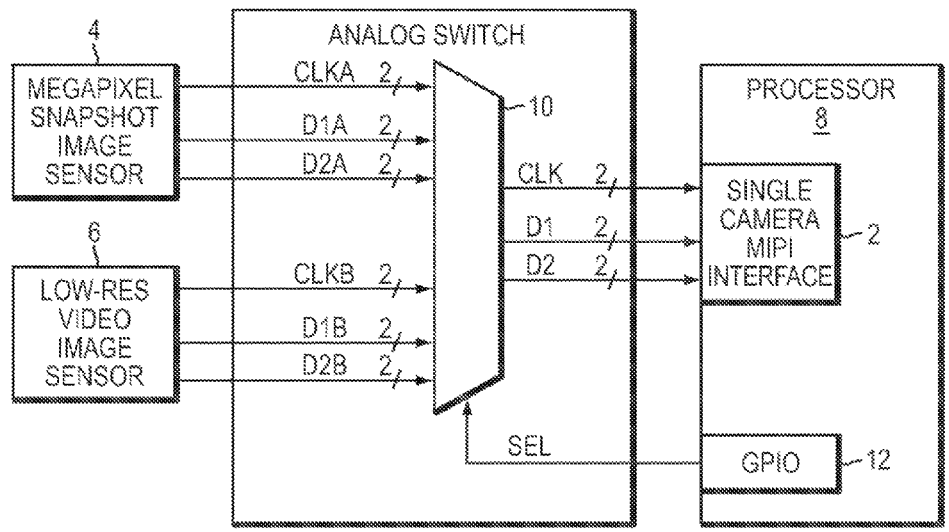
FIG. 1 is a schematic/block diagram of a prior art MIPI interface.
Figure 2:
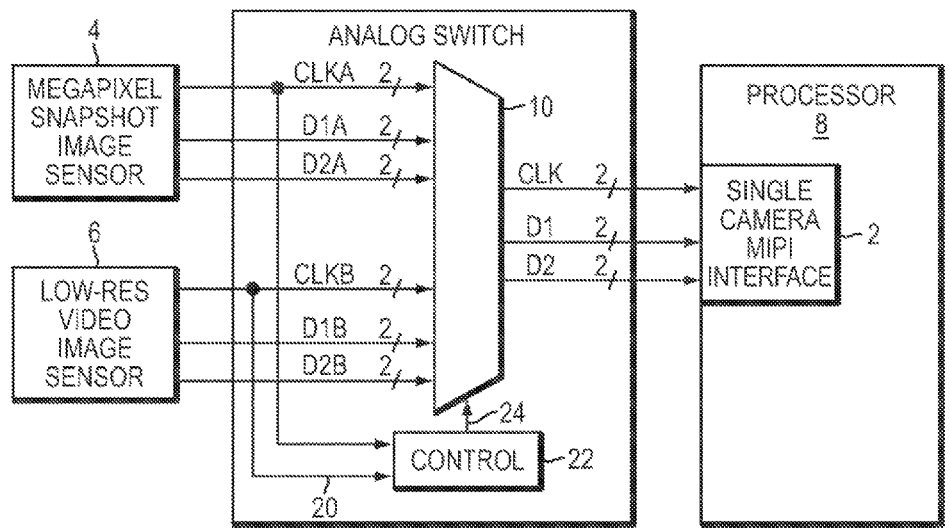
FIG. 2 is a schematic/block diagram embodiment of the present invention.

FIG. 2 differs from FIG. 1 only in the elimination of the GPIO 12 and the addition the CONTROL 22. The CLKA and the CLKB both connect to the CONTROL 22, The CONTROL outputs a signal 24 that turns on one of the two paths through the analog switch 10 that connects either item 4 or 6 to the MIPI interface 2.

Figure 3:
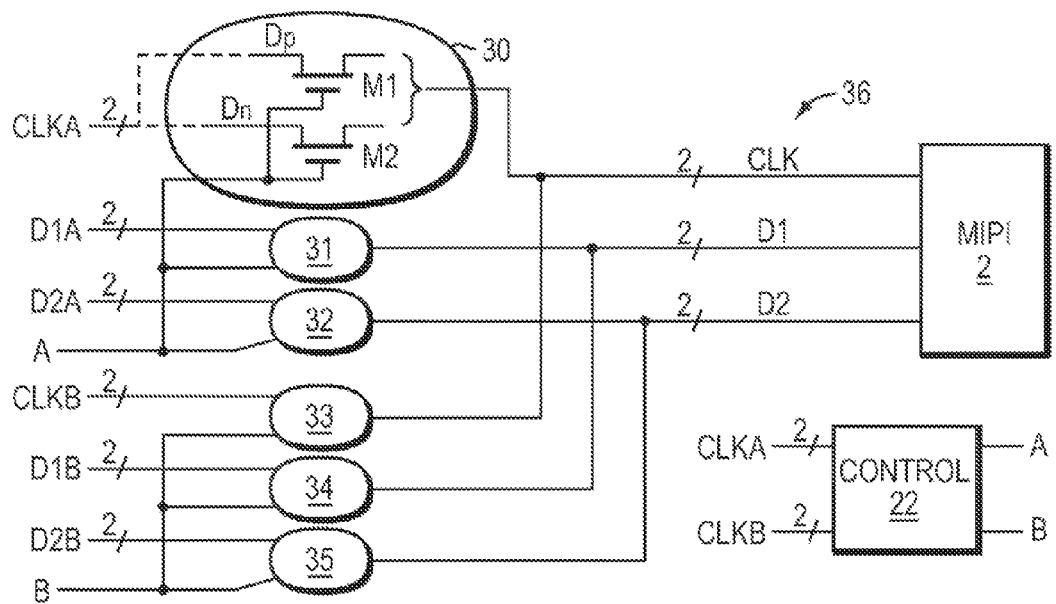
FIG. 3 is an illustration of an analog switch.

FIG. 3 represents the switch 10. Each item 30, 31, 32, 33, 34 and 35 comprises two, preferably MOSFET switches M1, M2 as illustrated for item 30, that carry each of the two indicated signals of each lane through to the MIPI interface The CONTROL 22 output A, when true, turns on the switches 30, 31 and 32 allowing the signal pairs: CLKA, D1A, and D2A to appear at the output 36. The inverse (of A) signal B turns on switches 33, 34, and 35 allowing CLKB, D1B, and D2B to appear at the output 36.

Figure 4:
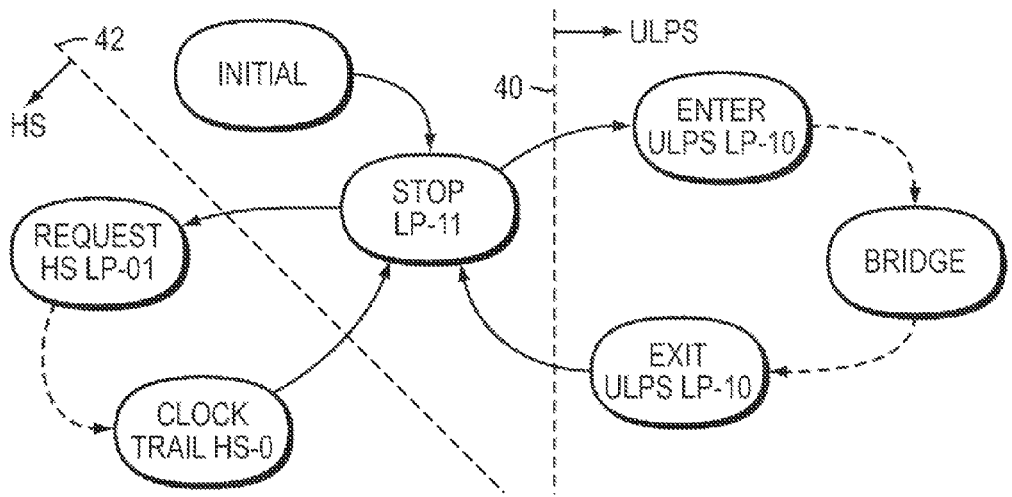
FIG. 4 is a flow chart illustrating states of a clock lane.

FIG. 4 illustrates a clock lane flow chart. Note that from the STOP LP-11 state the system crosses the dotted line 40 to enter the ULPS (Ultra Low Power State) by having an LP-10 input, and the system must return to the STOP LP-11 state before it can cross the dotted line 42 to enter the REQUEST HS LP-10 (High Speed) state.

During HS operation, the clock lane exhibits a low voltage differential swing used to clock in data from the data lanes. As noted above, a HS and the ULPS states will always begin and end in a STOP state When in a HS state, the system will only allow entry into the STOP state when there are no HS transmissions on any data lane.

Figure 5:
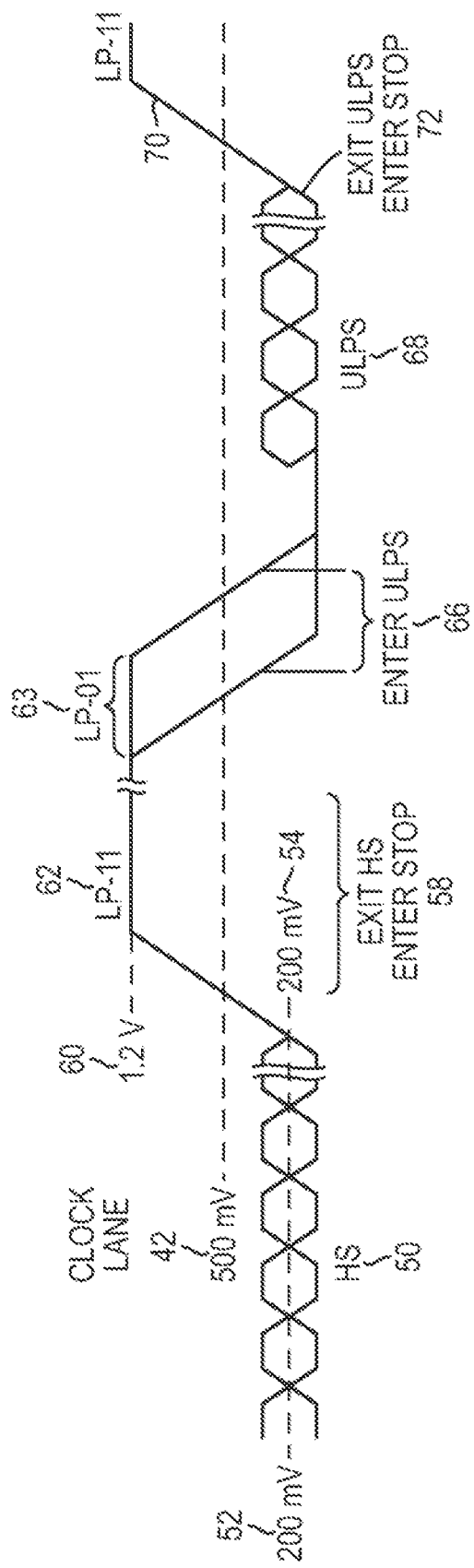
FIG. 5 is a representative timing diagram of MIPI clock signals.

FIG. 5 illustrates a timing sequence of a clock lane. In a HS state 50 the clock lane illustrates a differential signal 52 of about 200 mV at a common mode level 54 of about 200 mV. When both clock signal lines go high 60 to about 1.2V, the STOP LP-11 state 62 is entered. From this STOP state, when LP-01 63 occurs the system enters 66 the ULPS state 68. Later the clock signal may both go high to the 1.2V level 70 returning the system to the STOP state 70.

Still referring to FIG. 5, a 500 mV level 42 may serve as a voltage level that the clock signal only exceeds when exiting the HS or the ULPS states to enter the STOP state Both the Dp and Dn signals on the clock lane pair go high at 58 and 70, although only the Dp or the Dn signal might be monitored to detect this entering of the STOP state.

Figure 6:
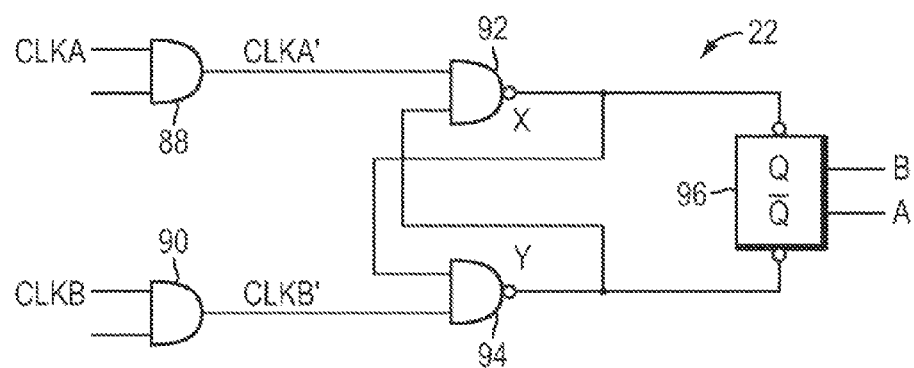
FIG. 6 is a logic table illustrating the logic states from the controller.

FIG. 6 illustrates one logic approach that may be employed that demonstrates the present invention. The approaches are logic gates, or comparators, with thresholds in the 500 mV range. When a high clock signal level exceeds the threshold, a logic signal is generated that will connect one of two sensors items 4 and 6 (FIG. 2) to the MIPI interface 2 (FIG. 2).

In FIG. 6 both differential signals (Dp, Dn) of CLKA are input to a AND gate 88 that outputs CLKA', and both differential signals of CLKB are input to AND gate 90 that 20 outputs CLKB'. Note although both Dp and Dn signals of CLKA and CLKB are being used here, as mentioned above, in other applications only one signal from each clock lane may be used. Moreover, the AND gates 88 and 90 could be OR gates but still arranged with high (500 mV) thresholds.

Figure 7:
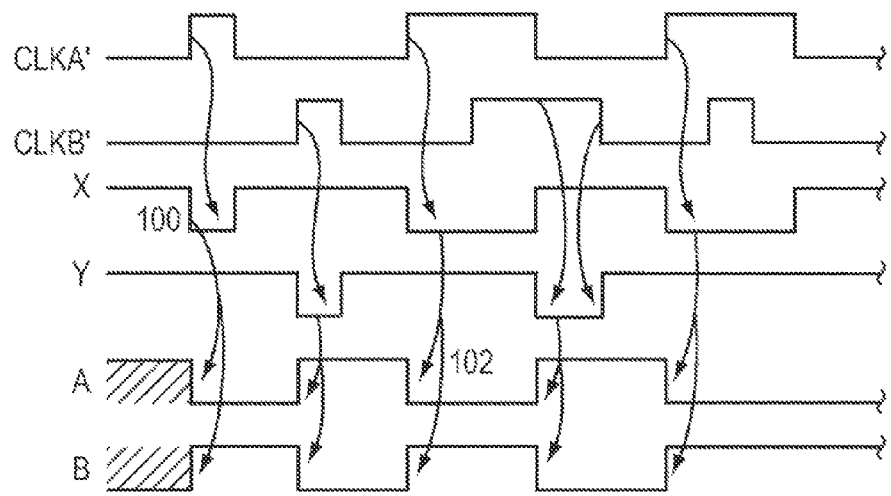
FIG. 7 is a timing chart for the circuit of FIG. 6.

Referencing FIGS. 6 and 7, if Y is high, when CLKA goes high it drives the X output low 100. The X output connects to the low true set input of the latch 96. Similarly if the V signal is high, when CLKB' goes high it drives the X output low 102. The Y output connects to the low true reset input of the latch 96. The NANDs 92 and 94 are cross coupled forming a set reset latch.

The Q output of the latch 96 is the A signal from FIG. 3 that connects the CLKA and the A data lanes to the MIPI interface 2, and the B signal connects the CLKB and B data lanes to the MIPI interface 2. A and B will be logic inverses of each other.

Note that since both the CLKA and CLKB could be high at the same time, both in the STOP state, the latch 96 will remain in the state determined by the last low signal on either X or Y. In the case of FIG. 7, X goes low and sets the latch 96 keeping B high and A low 102, and this state is maintained to the end of the timing chart.

Other logic circuits (not shown), including clocked logic, may be employed replacing FIG. 6 that will accomplish the same result, but with more timing preciseness.

Note that the gates 88 and 90 of FIG. 6 may be replaced by comparators that compare a reference voltage to one of the Dp or Dn clock lane signals. The comparator and reference voltage will more accurately determine the thresholds.

The result is that when a Dp or Dn (or both) CLKA signal goes high, sensor B may be connected to the MIPI interface, and when a Dp or Dn (or both) CLKB goes high, sensor A may be connected to the MIPI interface.

It should be understood that above-described embodiments are being presented herein as examples and that many variations and alternatives thereof are possible. Accordingly, the present invention should be viewed broadly as being defined only as set forth in the hereinafter appended claims.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description, The Abstract is provided to comply with 37 C.F.R. §1.72(b), to allow the reader to quickly ascertain the nature of the technical disclosure, It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim, Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations, The scope of the invention should be determined with reference to the appended claims, along with the full scope of equivalents to which such claims are entitled.

What is claimed is:

1. An apparatus comprising:
an analog switch including:
a first input configured to receive a first mobile industry processor interface (MIPI) signal source;
a second input configured to receive a second MIPI signal source;
a control input configured to receive a control signal; and
an output configured to couple one of the first or second MIPI signal source to a MIPI interface according to the control signal; and
a controller configured to receive at least one of a first clock signal from the first MIPI signal source or a second clock signal from the second MIPI signal source, to determine one of the first or second MIPI signal sources to couple to the MIPI interface using at least one of the first or second clock signals, and to provide the control signal to the control input of the analog switch using the determination.

2. The apparatus of claim 1, wherein the controller is configured to determine one of the first or second MIPI signal sources to couple to the MIPI interface using a voltage of at least one of the first or second clock signals.

3. The apparatus of claim 2, wherein at least one of the first or second clock signals includes a clock signal voltage swing and a control voltage swing larger than the clock signal voltage swing, and
wherein the controller is configured to detect the control voltage swing on one of the first or second clock signals and to determine one of the first or second MIPI signal sources to couple to the MIPI interface using the detected control voltage swing.

4. The apparatus of claim 1, wherein the controller is configured to compare one of the first or second clock signals to a threshold and to determine one of the first or second MIPI signal sources to couple to the MIPI interface using the comparison.

5. The apparatus of claim 4, wherein the threshold is 200 mV.

6. The apparatus of claim 4, wherein the threshold is 500 mV.

7. The apparatus of claim 1, wherein the controller is configured to receive the first and second clock signals and to determine one of the first or second MIPI signal sources to couple to the MIPI interface using the first and second clock signals.

8. The apparatus of claim 7, wherein the first and second clock signals includes a clock signal voltage swing and a control voltage swing larger than the clock signal voltage swing, and
wherein the controller is configured to detect the control voltage swing on one of the first or second clock signals and to determine one of the first or second MIPI signal sources to couple to the MIPI interface using the detected control voltage swing.

9. The apparatus of claim 7, wherein the controller is configured to compare the first clock single to a first threshold and the second clock signal to a second threshold and to determine one of the first or second MIPI signal sources to couple to the MIPI interface using the comparisons.

10. The apparatus of claim 9, wherein the first and second thresholds are 200 mV.

11. The apparatus of claim 9, wherein the first and second thresholds are 500 mV.

12. The apparatus of claim 1, wherein the first MIPI signal source includes first differential inputs (D1A, D1B) and the second MIPI signal source includes second differential inputs (D2A, D2B),
wherein the controller is configured to receive the first and second clock signals and the first and second differential inputs and to determine one of the first or second MIPI signal sources to couple to the MIPI interface using the first and second clock signals and the first and second differential inputs.

13. A method comprising:
receiving first and second mobile industry processor interface (MIPI) signal sources;
receiving at least one of a first clock signal from the first MIPI signal source or a second clock signal from the second MIPI signal source;
determining one of the first or second MIPI signal sources to couple to the MIPI interface using at least one of the first or second clock signals;

coupling one of the first or second MIPI signal sources to a MIPI interface according to the determining using an analog switch.

14. The method of claim 13, wherein the determining one of the first or second MIPI signal sources to couple to the MIPI interface includes using a voltage of at least one of the first or second clock signals.

15. The method of claim 14, wherein at least one of the first or second clock signals includes a clock signal voltage swing and a control voltage swing larger than the clock signal voltage swing, and wherein the determining one of the first or second MIPI signal sources to couple to the MIPI interface includes detecting the control voltage swing on one of the first or second clock signals and determining one of the first or second MIPI signal sources to couple to the MIPI interface using the detected control voltage swing.

16. The method of claim 13, including:
comparing one of the first or second clock signals to a threshold,
wherein the determining one of the first or second MIPI signal sources to couple to the MIPI interface includes using the comparison.

17. The method of claim 16, wherein the threshold is 200 mV.

18. The method of claim 16, wherein the threshold is 500 mV.

19. The method of claim 13, wherein the receiving at least one of the first and second clock signals includes receiving the first and second clock signals, and
wherein the determining one of the first or second MIPI signal sources to couple to the MIPI interface includes using the first and second clock signals.

20. The method of claim 19, wherein at least one of the first or second clock signals includes a clock signal voltage swing and a control voltage swing larger than the clock signal voltage swing, and wherein the determining one of the first or second MIPI signal sources to couple to the MIPI interface includes detecting the control voltage swing on one of the first or second clock signals and determining one of the first or second MIPI signal sources to couple to the MIPI interface using the detected control voltage swing.

21. The method of claim 19, including:
comparing the first clock signal to a first threshold;
comparing the second clock signal to a second threshold; and
determining one of the first or second MIPI signal sources to couple to the MIPI interface using the comparisons.

22. The method of claim 21, wherein the first and second thresholds are 200 mV.

23. The method of claim 21, wherein the first and second thresholds are 500 mV.

24. The method of claim 13, wherein the first MIPI signal source includes first differential inputs (D1A, D1B) and the second MIPI signal source includes second differential inputs (D2A, D2B), wherein the receiving at least one of the first or second clock signals includes receiving the first and second clock signals and the first and second differential inputs, and wherein the determining one of the first or second MIPI signal sources to couple to the MIPI interface includes using the first and second clock signals and the first and second differential inputs.

* * * * *